United States Patent
Yap et al.

(10) Patent No.: US 9,401,339 B2
(45) Date of Patent: Jul. 26, 2016

(54) WAFER LEVEL PACKAGES HAVING NON-WETTABLE SOLDER COLLARS AND METHODS FOR THE FABRICATION THEREOF

(71) Applicants: Weng F. Yap, Chandler, AZ (US); Alan J. Magnus, Gilbert, AZ (US)

(72) Inventors: Weng F. Yap, Chandler, AZ (US); Alan J. Magnus, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/277,343

(22) Filed: May 14, 2014

(65) Prior Publication Data

US 2015/0333028 A1     Nov. 19, 2015

(51) Int. Cl.
| | |
|---|---|
| *H01L 23/52* | (2006.01) |
| *H01L 23/00* | (2006.01) |
| *B23K 1/20* | (2006.01) |
| *B23K 1/00* | (2006.01) |
| *H01L 23/31* | (2006.01) |
| *B23K 3/06* | (2006.01) |

(52) U.S. Cl.
CPC .............. *H01L 24/20* (2013.01); *B23K 1/0016* (2013.01); *B23K 1/20* (2013.01); *B23K 3/0623* (2013.01); *H01L 23/3128* (2013.01); *H01L 24/11* (2013.01); *H01L 24/14* (2013.01); *H01L 24/19* (2013.01); *H01L 2224/04105* (2013.01); *H01L 2224/11013* (2013.01); *H01L 2224/11334* (2013.01); *H01L 2224/11849* (2013.01); *H01L 2224/12105* (2013.01); *H01L 2224/13016* (2013.01); *H01L 2924/01022* (2013.01); *H01L 2924/0132* (2013.01); *H01L 2924/01074* (2013.01)

(58) Field of Classification Search
CPC .................. H01L 23/49816; H01L 23/49811; H01L 23/488; H01L 24/81; H01L 24/05; H01L 24/13; H01L 2224/0401; H01L 2224/05008; H01L 2224/05017; H01L 2224/05015; H01L 2224/05098
See application file for complete search history.

(56) References Cited

U.S. PATENT DOCUMENTS

| | | | |
|---|---|---|---|
| 6,578,755 B1 | 6/2003 | Elenius et al. | |
| 6,878,465 B2 | 4/2005 | Moon et al. | |
| 6,930,032 B2 | 8/2005 | Sarihan et al. | |
| 7,132,303 B2 | 11/2006 | Wang et al. | |
| 7,989,356 B2 | 8/2011 | Bao et al. | |
| 2003/0020145 A1* | 1/2003 | Umezaki | 257/657 |
| 2003/0025202 A1* | 2/2003 | Mikagi et al. | 257/737 |
| 2004/0046252 A1* | 3/2004 | Fujimori et al. | 257/734 |
| 2005/0017375 A1* | 1/2005 | Ko | H01L 23/49816 257/782 |
| 2005/0070083 A1* | 3/2005 | Johnson et al. | 438/612 |
| 2013/0187277 A1 | 7/2013 | Chen et al. | |

* cited by examiner

*Primary Examiner* — Zandra Smith
*Assistant Examiner* — Evan Clinton

(57) ABSTRACT

Wafer level packages and methods for producing wafer level packages having non-wettable solder collars are provided. In one embodiment, the method includes forming solder mask openings in a solder mask layer exposing regions of a patterned metal level underlying the solder mask layer. Before or after forming solder mask openings in the solder mask layer, non-wettable solder collars are produced extending partially over the exposed regions of the patterned metal level. Solder balls are deposited onto the non-wettable solder collars and into the solder mask openings such that circumferential clearances are provided around base portions of the solder balls and sidewalls of the solder mask layer defining the solder mask openings.

20 Claims, 3 Drawing Sheets

WAFER LEVEL PACKAGES HAVING NON-WETTABLE SOLDER COLLARS AND METHODS FOR THE FABRICATION THEREOF

TECHNICAL FIELD

Embodiments of the present invention relate generally to microelectronic packaging and, more particularly, to wafer level packages and methods for producing wafer level packages having non-wettable solder collars.

BACKGROUND

Wafer level packaging processes can be broadly divided into two categories: Fan-In Wafer Level Packaging and Fan-Out Wafer Level Packaging processes. Fan-In Wafer Level Packaging processes enable the production of Fan-In Wafer Level Packages (FI-WLPs) containing one or more non-encapsulated die. Fan-In Wafer Level Packaging processes can be performed entirely on the wafer level, while producing FI-WLPs having planform dimensions equal to or nearly equal to the size of die (also commonly referred to as "Chip Scale Packages"). Electrical interconnection between the packaged die and the external contact array can be provided by a leadframe, an interposer, or a number of redistribution layers (RDLs), depending upon the particular packaging approach employed. By comparison, Fan-Out Wafer Level Packaging processes allow the production of larger Fan-Out Wafer Level Packages (FO-WLPs) having peripheral fan-out areas, which enlarge the surface area of the package topside over which a contact array can be formed. In an example of one known FO-WLP packaging approach, an array of singulated die is encapsulated in a molded panel over which one or more RDLs and a Ball Grid Array (BGA) are produced. The RDLs contain one or more metal levels or layers, which are patterned to define interconnect lines electrically coupling the packaged die to the BGA solder balls. After formation of the RDLs and the BGA, the panel is singulated to yield a number of microelectronic packages each containing a semiconductor die embedded within a molded body. Relative to CSP packages, FO-WLPs typically provide an increased I/O pin count and superior mechanical protection of the packaged die.

Prior to producing a BGA on a WLP, a solder mask layer is deposited over the outermost or last patterned metal level and lithographically patterned to create openings exposing selected regions of the interconnect lines within the metal level. Solder balls are deposited in the solder mask openings and contact the exposed regions of the interconnect lines. Solder reflow is then performed to bond the solder balls to interconnect lines. By common practice, the solder balls are deposited to sizes exceeding the planform dimensions of the solder mask openings such that, after reflow, the solder balls fill and cover the openings over which they are deposited. In general, this produces a structurally robust contact array. However, in rare instances, crack formation and delamination can occur within the RDLs at or near the interfaces between the solder mask layer and the BGA solder balls after prolonged thermal cycling. Crack formation within the RDLs can negatively impact WLP performance and can potentially result in rejection of the WLP due to failure during electrical testing.

There thus exists an ongoing need to provide WLPs and methods for fabricating WLPs that include solder balls deposited over one or more RDLs, while having a reduced likelihood of crack formation and delamination at or near the solder ball-RDL interfaces. Other desirable features and characteristics of the present invention will become apparent from the subsequent Detailed Description and the appended Claims, taken in conjunction with the accompanying Drawings and the foregoing Background.

BRIEF DESCRIPTION OF THE DRAWINGS

At least one example of the present invention will hereinafter be described in conjunction with the following figures, wherein like numerals denote like elements, and.

Figure 1:
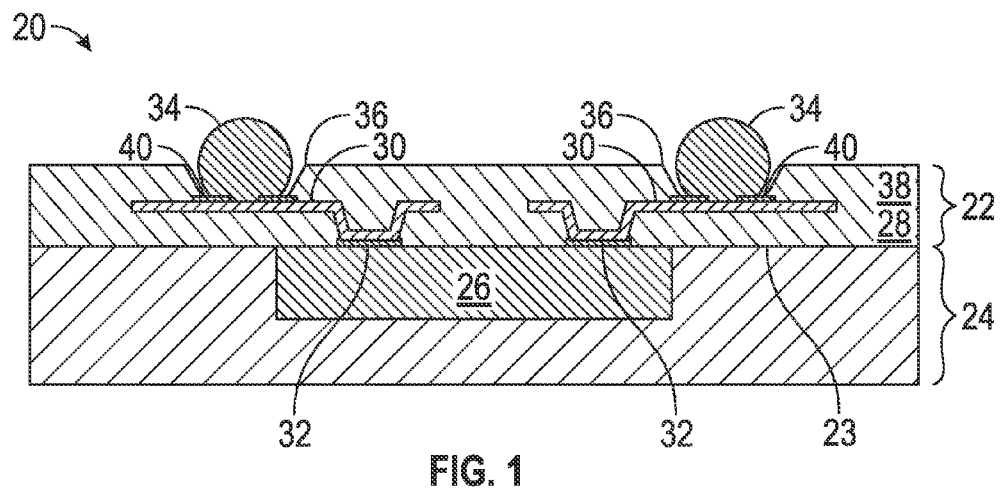
FIG. 1 is cross-sectional views of a FO-WLP having non-wettable solder collars, which support solder balls over formed on one or more RDLs and which decrease the likelihood of crack formation within the RDLs, as illustrated in accordance with a first exemplary embodiment of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following describes WLPs and methods for producing WLPs having non-wettable solder collars, which support solder balls formed on one or more RDLs to decrease the likelihood of crack formation and delamination within the RDLs. The solder balls are deposited onto the non-wettable solder collars, which prevent or at least impede the undesired lateral creep of the solder balls during reflow. The non-wettable solder collars are contained within the RDLs and exposed through solder mask openings, which are formed in the outermost dielectric layer of the RDLs (the "solder mask layer"). The solder mask openings are imparted with enlarged planform dimensions relative to the solder ball size. Due to the disparity in planform dimensions of the solder mask openings and the solder balls, circumferential clearances are created between the solder balls and the sidewalls of the solder mask layer defining the solder mask openings. The non-wettable solder collars enable this circumferential clearance to be sufficiently preserved through the reflow process to prevent contact between the BGA solder balls and the solder mask layer. As a result, a controlled circumferential clearance or annular gap is created between the reflowed solder balls and the sidewalls of the solder mask layer defining the solder mask openings. It has been determined that such a non-contacting design decreases the likelihood of delamination or crack formation with the RDLs to improve throughput of the WLP during original manufacture and the overall reliability of the WLP during in-field usage.

Exemplary embodiments of WLPs having non-wettable solder collars are described below in conjunction with FIGS. 1-6. In the below-described embodiments, the exemplary WLPs are implemented as FO-WLPs, which are advantageously produced by panel level processing of a molded panel containing a plurality of microelectronic devices thereby enabling a relatively large number of FO-WLPs to be manufactured in parallel. The following description notwithstanding, it is emphasized that embodiments of the WLPs can also be implemented as FI-WLPs or CSPs including non-wettable solder collars of the type described below. In embodiments wherein the fabrication method is utilized to produce FI-WLPs, a non-singulated semiconductor wafer can be processed in the manner described below (e.g., via the build-up of one or more RDLs thereover, the formation of the solder collars prior to or after deposition and patterning of the solder mask layer, and deposition and reflow of the solder balls) and subsequently singulated to yield a number of completed FI-WLPs including RDLs and solder balls wherein the likelihood of crack formation near the solder ball-RDL interfaces is reduced.

FIG. 1 illustrates, in simplified cross-section, a FO-WLP 20 including a one or more RDLs 22, which have been built-up over the frontside 23 of a molded package body 24 containing at least one embedded microelectronic component. For example, as indicated in FIG. 1, molded package body 24 can contain a semiconductor die 26 having a number of bond pads 32 underlying RDLs 22. RDLs 22 include a body of dielectric material 28 containing at least one patterned metal level. The outermost or last patterned metal level contained within RDLs 22 (that is, the metal level located furthest from package body 24) is referred to herein as the "$M_{LAST}$ level." The $M_{LAST}$ level can be the only patterned metal level contained within RDLs 22, as is the case in the relatively simple example shown in FIG. 1. Alternatively, the $M_{LAST}$ level can be final or outermost patterned metal level of multiple metal levels formed within RDLs 22. In this regard, it is not uncommon for WLP having a relatively complex wiring structure to include four or more patterned metal levels within the RDLs. The metal level or levels are patterned to define electrically-conductive features included within FO-WLP 20, which include a plurality of interconnect lines 30. Interconnect lines 30 and other electrically-conductive features contained within RDLs 22 (e.g., metal plugs) provide electrical communication between bond pads 32 of die 26 and BGA solder balls 34 formed over the topside of package 20.

With continued reference to the exemplary embodiment shown in FIG. 1, BGA solder balls 34 are formed in contact with regions of interconnect lines 30 (and, more generally, the $M_{LAST}$ level) exposed through openings 36 formed in the outermost or final RDL (identified in FIG. 1 by reference numeral "38"). Outermost dielectric layer 38 is referred to hereafter as "solder mask layer 38," and openings 36 are referred to hereafter as "solder mask openings 36." This terminology is utilized with the understanding solder balls 34 do not physically contact the sidewalls of solder mask layer 38 defining solder mask openings 36, as is typical of solder mask layers and openings in conventional packages. Instead, solder balls 34 are separated from the sidewalls of solder mask layer 38 defining solder mask openings 36 by controlled annular gaps or circumferential clearances. These circumferential clearances are produced by forming solder mask openings 36 to have enlarged planform dimensions relative to solder balls 34 and by depositing solder balls 34 onto non-wettable solder collars 40, which overlay the $M_{LAST}$ level and which prevent or at least deter the undesired lateral distortion of solder balls 34 during reflow. Solder collars 40 can be composed of any non-solder-wettable material suitable for performing this purpose, whether electrically conductive or insulative; the term "non-solder-wettable" and the abbreviated term "non-wettable" defined herein as describing materials that do not form an intermetallic bond with molten solder during reflow performed in accordance with a predetermined heating scheduled, such as a lead-free or eutectic reflow heating schedule. Non-wettable solder collars 40 are further described below in conjunction with FIGS. 2 and 3.

Figure 2:
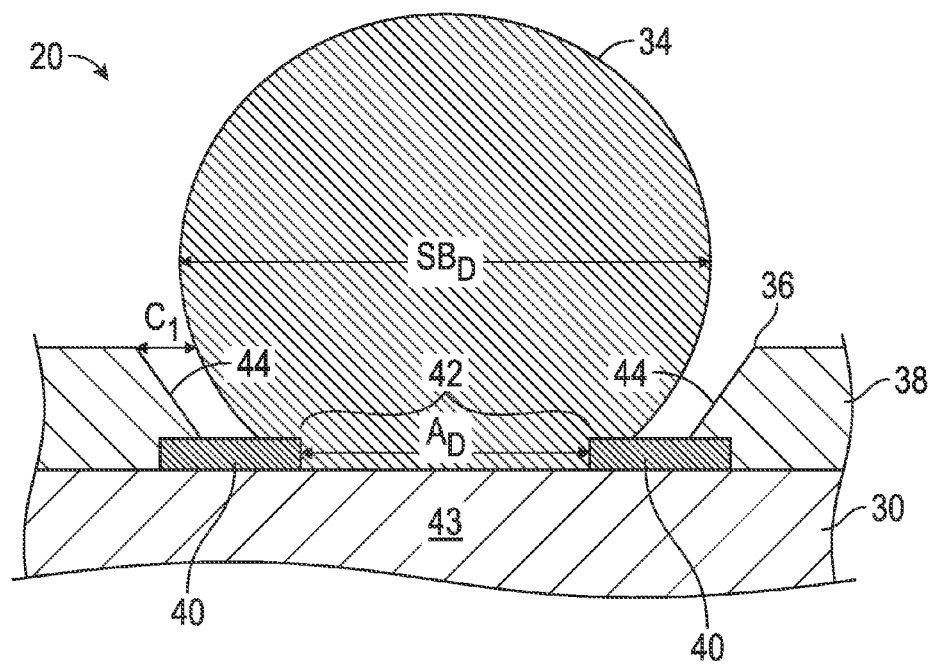
FIGS. 2 and 3 are cross-sectional and planform views, respectively, of a portion of the FO-WLP shown in FIG. 1 illustrating one of the non-wettable solder collars and the overlying BGA solder ball in greater detail.
Figure 3:
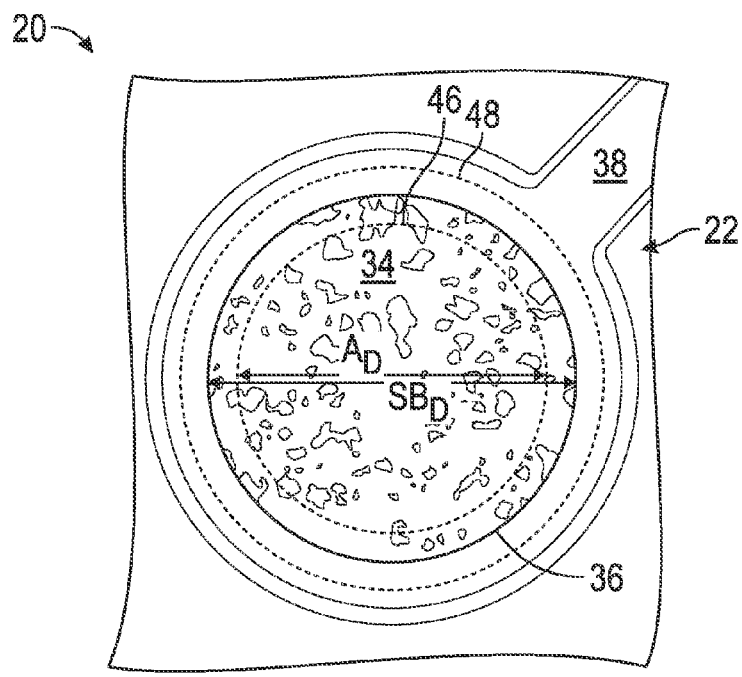

FIGS. 2 and 3 are cross-sectional and planform views, respectively, of a portion of FO-WLP 20 illustrating a non-wettable solder collar 40 and the overlying BGA solder ball 34 in greater detail. In FIG. 3, non-wettable solder collar 40 is hidden from view by solder ball 34 and solder mask layer 38 and is consequently shown in phantom (the inner and outer edges of solder collar 40 represented by dashed lines 46 and 48, respectively). Non-wettable solder collars 40 are formed to have generally ring-shaped or annular bodies, which can have generally circular or ovular planform shapes (shown in FIG. 3), polygonal shapes, or other shapes suitable for providing the below-described stand-off function. Central openings or apertures 42 are formed in solder collars 40. Apertures 42 permit solder balls 34 supported by solder collars 40 to physically and ohmically contact the underlying regions of the $M_{LAST}$ level defining interconnect lines 30 (also referred to herein as "solder ball contact points," one of which is identified in FIG. 2 by reference numeral "43"). In embodiments wherein apertures 42 have circular planform geometries, central apertures 42 can be formed to have diameters (identified in FIGS. 2 and 3 as "$A_D$") greater than at least one half the diameter of solder balls 34, as considered post reflow and identified in FIGS. 2 and 3 by as "$SB_D$." In addition to permitting direct or intimate ohmic contact between solder balls 34 and contact points 43 (FIG. 2), central apertures 42 also help to prevent undesired lateral excursion of solder ball 34 and retain solder ball 34 in its desired position during reflow. Finally, it will be noted that the dimensions of central apertures 42, and not the dimensions solder mask openings 36, are partially determinative of the post-reflow dimensions of solder ball 34. For example, the volumes of apertures 42 and, therefore, the amount of solder inflow into each opening can accommodate during reflow, is partially determinative of the final solder ball height.

The dimensions of non-wettable solder collars 40 will vary amongst embodiments. In general, the widths or outer diameters of non-wettable solder collars 40 will exceed the widths of the base portions of solder balls 34 that seat within solder collars 40; although the widths of solder collars 40 may or may not exceed the maximum diameters of solder balls 34 in their reflowed state. The heights or thicknesses of non-wettable solder collars 40 can also vary. Generally, in the embodiment shown in FIGS. 1-3, non-wettable solder collars 40 will have thicknesses less than and typically a fraction of the thickness of solder mask layer 38 and the underlying patterned metal level defining interconnect lines 30. Here, it should be noted that the thickness of solder collars 40 is largely incidental to the ability of collars 40 to provide the below-described stand-off function as it is the upper or outer surface of collars 40 (i.e., the surface of collars 40 opposite the $M_{LAST}$ level) providing this function. Thus, solder collars 40 can be formed to have minimal thickness, while still enabling reliable production of collars 40. The thicknesses of solder collars 40 will often be less than one tenth and, in many cases, a small fraction of the thickness of solder mask layer 38 and the $M_{LAST}$ level. In one embodiment, solder collars 40 are formed to have a substantially uniform thickness between about 0.05 and about 0.2 microns (μm), while the thickness of the $M_{LAST}$ level is about 10 μm. In further embodiments, collars 40 can have thicknesses greater than or less than the aforementioned range. Finally, as indicated in FIGS. 1-3, the outer planform dimensions of solder collars 40 can exceed the planform dimensions of solder mask opening 36, as taken at its bottom, such that the outer peripheral portions of collars 40 underlie and remain covered by solder mask layer 38 after the formation of openings 36. However, this need not always be the case; and solder collars 40 can be fully revealed by solder mask openings 36 in further embodiments.

As noted above, annular gaps or circumferential clearances are formed between solder balls 34 and the sidewall surfaces of solder mask layer 38 defining solder mask openings 36. As shown in FIG. 2, specifically, a circumferential clearance ($C_1$) is provided between the base portion of illustrated solder ball 34 and the slanted sidewalls 44 of layer 38 defining the illustrated solder mask opening 36. In many cases, clearance $C_1$ will have a gap width between about 1 and about 50 μm; however, clearance $C_1$ can have any practical width, providing that clearance $C_1$ extends around the base portion of solder ball 34 to prevent contact between ball 34 and solder mask layer 38. Circumferential clearances are created during initial deposition of solder balls 34 by forming solder mask openings 36 to have enlarged planform dimensions relative to the solder ball size. The clearances are preserved through the solder reflow process due to the non-wettable nature of solder collars 40, which prevent or deter undesired lateral creep of solder ball 34 during the reflow process. The end result is the structure shown in FIGS. 1-3 wherein WLP 20 includes a number of BGA solder balls 34, which are substantially free-standing and which are offset from solder mask layer 38 by controlled circumferential clearances $C_1$. It has been found that the likelihood of crack formation and delamination in RDLs 22 can be minimized by producing BGA solder balls 34 and RDLs 22 to have such a non-contacting design, as enabled by the formation of non-wettable solder collars 40. Without being bound by theory, it is believed that cracks can form at the interfaces between the RDLs and BGA solder balls designs across thermal cycles due to difference in Coefficients of Thermal Expansion (CTE) and trapped air pockets in conventional, contacting designs. In the case of WLP 20, BGA solder balls 34 do not contact RDLs 22 and little to no voiding occurs during solder ball reflow thereby eliminating the above-mentioned factors believed to contribute to crack formation within the redistribution layers over time.

By way of non-limiting example, one process suitable for fabricating WLP 20 can be performed as follows. First, an overmolding or panelization process is carried-out to produce a molded panel containing semiconductor die 26 along with a number of other semiconductor die and, possibly, other microelectronic components. During panelization, the molded panel can be produced utilizing a pour molding, compression molding, or lamination process, to list but a few examples. After panelization, RDL layers 22 are successively built-up over the frontside of the molded panel through which the semiconductor die are exposed. The $M_{LAST}$ level is deposited and then patterned to define interconnect lines 30. Non-wettable solder collars 40 are next formed at selected locations across the $M_{LAST}$ level and over interconnect lines 30. Various deposition and patterning process can be utilized for this purpose. By way of non-limiting example, a sputtering and patterning process can be utilized to form solder collars 40 from titanium tungsten (TiW) or other non-wettable alloys, which are different in composition from the solder-wettable metal or alloy (e.g., copper) utilized to produce the $M_{LAST}$ layer and interconnect lines 30. In an embodiment, a non-wettable alloy layer is first sputter deposited over the patterned $M_{LAST}$ level and interconnect lines 30, a layer of photoresist is then spun-on or otherwise deposited over the alloy layer, and the photoresist layer is photolithographically patterned to expose selected regions of the non-wettable alloy layer. The exposed regions of alloy layer are then removed by etching to transfer the desired pattern to the non-wettable alloy layer defining solder collars 40, and the photoresist layer is removed by treatment with a photoresist stripper chemical.

After formation of non-wettable solder collars 40, solder mask layer 38 can be deposited, and solder mask openings 36 are formed in layer 38 to reveal selected regions of the patterned $M_{LAST}$ level defining interconnect lines 30. Solder balls 34 are then deposited in solder mask openings 36 and in contact with solder collars 40 utilizing, for example, a bumping process or solder paste printing process. As previously stated, solder ball size is controlled during bumping such that a circumferential gap or clearance is created between solder balls 34 and RDL sidewalls 44 defining openings 36. Reflow is then carried-out under process conditions sufficient to maintain the circumferential clearances between solder balls 34 and RDL sidewalls 44, although a minimal amount of lateral expansion or creep of solder balls 34 can occur providing that contact does not occur with RDLs 22. Finally, the molded panel can be singulated utilizing a dicing saw, by laser cutting, or in another manner to separate WLP 20 and the other WLPs into discrete units. The resultant structure is shown in FIGS. 1-3 with the singulated piece of the molded panel included within WLP 20 corresponding to molded package body 24 shown in FIG. 1.

There thus has been provided exemplary embodiments of WLPs and methods for producing WLPs having non-wettable solder collars, which support BGA solder balls over formed one or more RDLs and which decrease the likelihood of cracking formation and delamination with the RDLs. In the above-described fabrication method, the non-wettable solder collars are produced prior to the formation of the solder mask layer such that the outer peripheral edges of the solder collars may or may not be exposed through the subsequently-formed solder mask openings. However, in further embodiments, the non-wettable solder collars can be produced after formation of the solder mask layer and the solder mask openings. In this case, the solder collars can be fully contained within the solder mask openings and may not extend under the solder mask layer. Exemplary embodiments of a WLP package produced utilizing such a fabrication approach will now be described below in conjunction with FIGS. 4-6.

Figure 4:
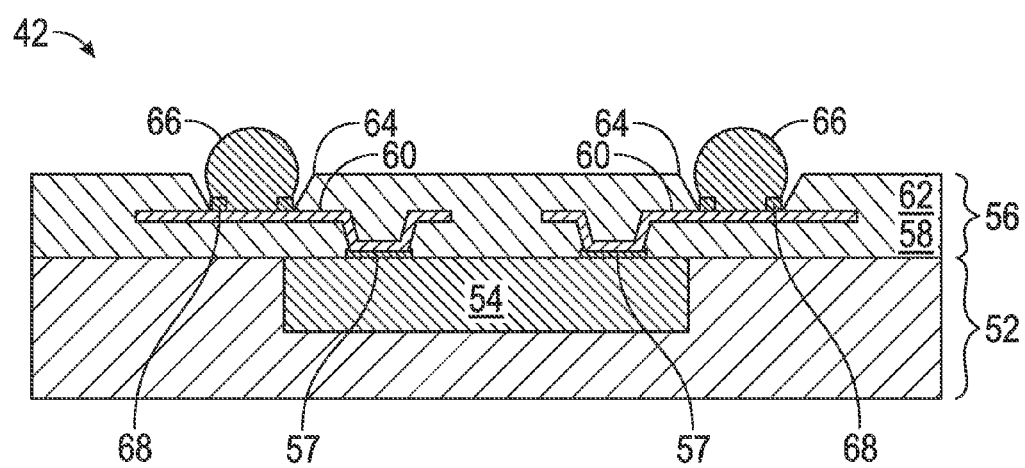
FIG. 4 is cross-sectional views of a FO-WLP having non-wettable solder collars, which support solder balls over formed on one or more RDLs and which decrease the likelihood of crack formation within the RDLs, as illustrated in accordance with a further exemplary embodiment of the present invention.

FIG. 4 is cross-sectional view of a FO-WLP 50, as illustrated in accordance with a further exemplary embodiment of the present invention. In many respects, FO-WLP 50 is similar to FO-WLP 20 described above in conjunction with FIGS. 1-3. For example, FO-WLP 50 includes a molded package body 52, a semiconductor die 54 embedded within package body 52, and a number of RDLs 56 produced over the frontside of package body 52. RDLs 56 include a body of dielectric material 58 containing a number of interconnect lines 60, which provide electrical communication between bond pads 57 of die 54 and a number of solder balls 66 deposited in a BGA over the package topside. The outermost dielectric layer 62 included within RDLs 56 (referred to herein as "solder mask layer 62") overlies the final or last metal level patterned to define interconnect lines 60 (again, referred to herein as the "$M_{LAST}$ level"). Solder mask openings 64 are formed in solder mask layer 62 to expose selected regions of the $M_{LAST}$ level defining interconnect lines 60. BGA solder balls 66 are deposited in solder mask openings 64 in contact with the exposed regions of interconnect lines 60 (and, more generally, the $M_{LAST}$ level). As was previously the case, solder balls 66 seat on non-wettable solder collars 68, which are produced at selected location across the $M_{LAST}$ level. One non-wettable solder collar 68 and the overlying solder ball 66 are illustrated in greater detail in FIG. 5. The respective dimensions of solder balls 66 and solder mask openings 62 are chosen such that circumferential gaps are created between solder balls 66 and the surrounding sidewalls 70 of solder mask layer 62 (identified in FIG. 5). As was the case previously, solder collars 68 prevent or at least deter the lateral deformation of solder balls 66 during reflow and thus preserve the circumferential gap between solder balls 66 and the surrounding sidewalls 70 of solder mask layer 62.

It should thus be appreciated that, as do solder collars 40 described above in conjunction with FIGS. 1-3, solder collars 68 enable a circumferential stand-off or clearance to be produced between solder balls 66 and the sidewall surfaces 72 of solder mask layer 62 defining solder mask openings 64. The likelihood of crack formation and delamination within RDLs 56 during thermal cycling of package 50 is reduced as a result. Furthermore, as were solder collars 40 (FIGS. 1-3), solder collars 68 are fabricated to include central apertures 74 through which solder balls 66 extend to ohmically contact the designated solder ball contact points 76 (identified in FIG. 5) provided on interconnect lines 60 and, more generally, at selected locations across the patterned $M_{LAST}$ level. However, solder collars 68 differ from solder collars 40 in a number of respects, as well. As described above, non-wettable solder collars 68 are formed after etching solder mask openings 64 in solder mask layer 62. Thus, solder collars 68 are contained fully in solder mask openings 64 and do not extend under solder mask layer 62. This may be more fully appreciated by referring to FIG. 6, which illustrates one solder collar 68 in phantom wherein collar 68 is hidden from view by overlying solder ball 66 (the inner and outer peripheral edges of collar 68 represented by dashed circles 78 and 80, respectively).

Figure 5:
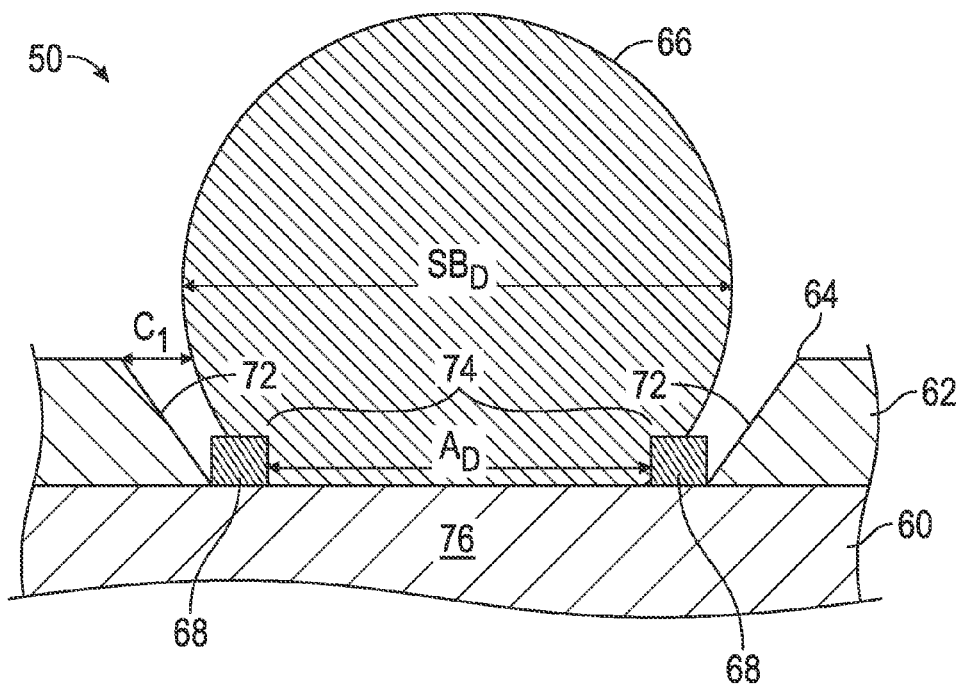
FIGS. 5 and 6 are cross-sectional and planform views, respectively, of a portion of the FO-WLP shown in FIG. 4 illustrating one of the non-wettable solder collars and the overlying BGA solder ball in greater detail.
Figure 6:
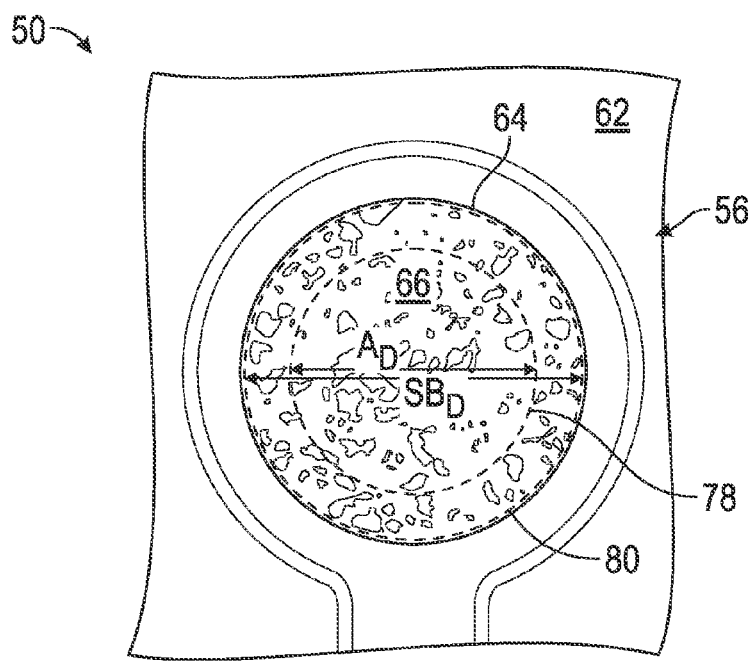

Referring collectively to FIGS. 4-6, non-wettable solder collars 68 can be produced from a wide range of non-solder wettable materials. As was the case previously, solder collars 68 can be produced by depositing a non-solder-wettable alloy layer and then patterning the alloy layer utilizing, for example, a sputtering and lithographic patterning process of the type described above. TiW is one example of a non-solder-wettable alloy well-suited for sputter deposition and patterning in this manner. Alternatively, a non-solder wettable material can be selectively deposited in a predetermined pattern to produce solder collars 68 utilizing, for example, a screen printing, needling dispensing, ink jet printing, spray, or other deposition process. In this case, the material utilized to produce solder collars 68 can be any material that is non-solder-wettable, which may or may not be electrically conductive. For example, an electrically-insulative or electrically-conductive epoxy layer can be dispensed or sprayed over and into solder mask openings 62 and then patterned utilizing, for example, a laser ablation process. In such embodiments, solder collars 68 can be deposited to heights or thicknesses substantially equivalent to or less than the height of solder mask layer 62 and, perhaps, to thicknesses between about 1 and about 20 μm. In still further embodiments, solder collars 68 can be selectively deposited in their desired patterns utilizing, for example, an ink jet or aerosol printing process without requiring deposition and patterning of a blank non-wettable layer.

There have thus been provided multiple exemplary embodiments of WLPs and methods for producing WLPs having non-wettable solder collars, which support solder balls over formed one or more RDLs and which decrease the likelihood of cracking formation and delamination with the RDLs. In the above-described embodiments, the solder balls are deposited in the non-wettable solder collars, which prevent or at least impede the undesired lateral creep of the solder balls during reflow. The non-wettable solder collars are contained within the RDLs and exposed through solder mask openings, which are formed in the outermost RDL and imparted with enlarged planform dimensions exceeding the solder ball diameter. Due to the difference in the planform dimensions of the solder mask openings and the solder ball diameter, a circumferential clearance is created between the solder balls and the sidewalls of the solder mask layer defining the solder mask openings. The non-wettable solder collars enable this circumferential clearance to be maintained through the reflow process, which enables a controlled gap to be created between the BGAs and the solder mask layer decreasing the likelihood of crack formation with the RDLs at or near the solder ball-RDL interfaces.

In one embodiment, the above-described WLP fabrication method includes the steps or processes of forming solder mask openings in a solder mask layer exposing regions of a patterned metal level underlying the solder mask layer. Before or after forming solder mask openings in the solder mask layer, non-wettable solder collars are produced extending at least partially over the exposed regions of the patterned metal level. Solder balls are deposited onto the non-wettable solder collars and into the solder mask openings such that circumferential clearances are provided around base portions of the solder balls and sidewalls of the solder mask layer defining the solder mask openings.

In a further embodiment, the above-described WLP fabrication method includes the steps or processes of sputter depositing a non-solder-wettable alloy layer over a patterned metal level having a plurality of solder ball contact points thereon. The non-solder wettable alloy layer is then patterned to define non-wettable solder collars circumscribing the plurality of solder ball contact points and having central openings through which the plurality of solder ball contact points are exposed. Solder balls are then deposited onto the non-wettable solder collars and heated to a predetermined reflow temperature to produce reflowed solder balls contacting the plurality of solder ball contact points through the central openings of the non-wettable solder collars.

Embodiments of a WLP having non-wettable solder collars have also been provided. In one embodiment, the WLP includes a patterned metal level, a solder mask layer overlying the patterned metal level, and solder mask openings formed in the solder mask layer and exposing regions of the patterned metal level. Non-wettable solder collars overlie the patterned metal level and have central apertures located in the solder mask openings. Reflowed solder balls seat on the non-wettable solder collars and contact the patterned metal level through the central apertures.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes can be made in the function and arrangement of elements described in an exemplary embodiment without departing from the scope of the invention as set-forth in the appended claims.

As appearing in the foregoing Detailed Description, terms such as "comprise," "include," "have," and the like are intended to cover non-exclusive inclusions, such that a process, method, article, or apparatus that comprises a list of elements is not necessarily limited to those elements, but can include other elements not expressly listed or inherent to such process, method, article, or apparatus. As still further appearing herein, terms such as "over," "under," "on," and the like are utilized to indicate relative position between two structural elements or layers and not necessarily to denote physical contact between structural elements or layers. Thus, a first structure or layer can be described as fabricated "over" or "on" a second structure, layer, or substrate without indicating that the first structure or layer necessarily contacts the second structure, layer, or substrate due to, for example, presence of one or more intervening layers. As appearing further herein, the term "microelectronic component" is utilized in a broad sense to refer to an electronic device, element, or structure produced on a relatively small scale and amenable to packaging in the below-described manner. Microelectronic components include, but are not limited to, integrated circuits formed on semiconductor die, Microelectromechanical Systems (MEMS) devices, passive electronic components, optical devices, and other small scale electronic devices capable of providing processing, memory, sensing, radiofrequency, optical, and actuator functionalities, to list but a few examples. Microelectronic components also include other discrete or separately-fabricated structures that can be integrated into the FO-WLP, such as prefabricated via structures and prefabricated antenna structures.

What is claimed is:

1. A method for producing a wafer level package, the method comprising:
   forming solder mask openings in a solder mask layer exposing regions of a patterned metal level underlying the solder mask layer, the patterned metal level comprising a first alloy;
   before or after forming solder mask openings in the solder mask layer, producing non-wettable solder collars in contact with and extending partially over the exposed regions of the patterned metal level, the non-wettable solder collars produced from a second alloy different than the first alloy; and
   depositing solder balls into the solder mask openings and onto the non-wettable solder collars and performing a solder ball reflow process such that, after solder ball reflow, circumferential clearances are provided around base portions of the solder balls and the sidewalls of the solder mask layer defining the solder mask openings, the circumferential clearances comprising annular gaps separating the portions of the solder balls contacting the non-wettable solder collars from the sidewalls of the solder mask layer defining the solder mask openings.

2. The method of claim 1 wherein producing comprises producing the non-wettable solder collars to include central openings in which the solder balls seat, the solder balls contacting the exposed regions of the patterned metal level through the central openings after deposition and reflow of the solder balls.

3. The method of claim 1 wherein producing comprises producing the non-wettable solder collars to have heights equivalent to or less than a thickness of the solder mask layer.

4. The method of claim 1 wherein the second alloy comprises titanium tungsten.

5. The method of claim 1 wherein producing comprises:
   sputter depositing a non-wettable alloy layer on the patterned metal level; and
   patterning the non-wettable alloy layer to define the non-wettable solder collars.

6. The method of claim 1 further comprising depositing the solder mask layer over the patterned metal level prior to producing the non-wettable solder collars.

7. The method of claim 6 wherein producing comprises dispensing a non-solder-wettable epoxy over the patterned metal level to form the non-wettable solder collars.

8. The method of claim 6 wherein producing comprises producing the non-wettable solder collars to be fully contained within the solder mask openings.

9. The method of claim 1 further comprising producing at least one redistribution layer over a semiconductor die embedded in a molded package body prior to forming the solder mask openings in the solder mask layer, the at least one redistribution layer containing the solder mask layer and the patterned metal level.

10. A method for producing a wafer level package, the method comprising:
    forming solder mask openings in a solder mask layer exposing regions of a patterned metal level underlying the solder mask layer;
    before or after forming solder mask openings in the solder mask layer, producing non-wettable solder collars in contact with and extending partially over the exposed regions of the patterned metal level;
    depositing solder balls into the solder mask openings and onto the non-wettable solder collars and performing a solder ball reflow process such that, after solder ball reflow, circumferential clearances are provided around base portions of the solder balls and the sidewalls of the solder mask layer defining the solder mask openings, the circumferential clearances comprising annular gaps separating the portions of the solder balls contacting the non-wettable solder collars from the sidewalls of the solder mask layer defining the solder mask openings; and
    depositing the solder mask layer over the patterned metal level after producing the non-wettable solder collars.

11. The method of claim 10 wherein forming comprises forming solder mask openings in the solder mask layer exposing regions of the patterned metal level underlying the solder mask layer and at least partially exposing the non-wettable solder collars.

12. The method of claim 11 wherein forming comprises forming the solder mask openings to partially expose the non-wettable solder collars, while leaving outer peripheral portion of the non-wettable solder collars covered by the solder mask layer.

13. The method of claim 10 wherein producing comprises producing the non-wettable solder collars to include central openings in which the solder balls seat, the solder balls contacting the exposed regions of the patterned metal level through the central openings after deposition and reflow of the solder balls.

14. The method of claim 10 wherein producing comprises producing the non-wettable solder collars to have heights equivalent to or less than a thickness of the solder mask layer.

15. The method of claim 10 wherein the patterned metal level comprises a first alloy, and wherein producing comprises producing the non-wettable solder collars from a second alloy different than the first alloy.

16. The method of claim 10 wherein producing comprises:
sputter depositing a non-wettable alloy layer on the patterned metal level; and
patterning the non-wettable alloy layer to define the non-wettable solder collars.

17. The method of claim 10 further comprising producing at least one redistribution layer over a semiconductor die embedded in a molded package body prior to forming the solder mask openings in the solder mask layer, the at least one redistribution layer containing the solder mask layer and the patterned metal level.

18. A method for producing a wafer level package, the method comprising:
sputter depositing a non-solder-wettable alloy layer over a patterned metal level having a plurality of solder ball contact points thereon, the patterned metal level comprising the last metal level included in at least one redistribution layer produced over a semiconductor die embedded in a molded package body;
patterning the non-solder wettable alloy layer to define non-wettable solder collars circumscribing the plurality of solder ball contact points and having central openings through which the plurality of solder ball contact points are exposed;
depositing solder balls onto the non-wettable solder collars; and
heating the solder balls to a predetermined reflow temperature to produce reflowed solder balls contacting the plurality of solder ball contact points through the central openings of the non-wettable solder collars.

19. The method of claim 18 further comprising:
before or after patterning the non-solder wettable alloy layer, depositing a dielectric layer over the patterned metal level; and
forming openings in the dielectric layer exposing the plurality of solder ball contact points;
wherein the solder balls are deposited onto the non-wettable solder collars to have reduced sizes relative to the openings formed in the dielectric layer such that circumferential clearances are created between the plurality of solder balls and sidewalls of the dielectric layer defining the openings; and
wherein heating is performed under process conditions sufficient to maintain circumferential clearances between the plurality of solder balls and sidewalls of the dielectric layer defining the openings.

20. The method of claim 18 further comprising:
forming solder mask openings in a solder mask layer deposited over the patterned metal level to expose the plurality of solder ball contact points through the solder mask layer; and
depositing and heating the solder balls under controlled reflow conditions providing annular air gaps separating the portions of the solder balls contacting the non-wettable solder collars from the sidewalls of the solder mask layer defining the solder mask openings.

* * * * *